United States Patent
Jahanghir et al.

(10) Patent No.: US 7,129,864 B2
(45) Date of Patent: Oct. 31, 2006

(54) FAST COMPACT DECODER FOR HUFFMAN CODES

(75) Inventors: Musa Jahanghir, Palo Alto, CA (US); Munsi A. Haque, San Jose, CA (US); Louis Lippincott, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/027,478

(22) Filed: Dec. 31, 2004

(65) Prior Publication Data

US 2006/0145898 A1 Jul. 6, 2006

(51) Int. Cl.
*H03M 7/00* (2006.01)

(52) U.S. Cl. .................... 341/106; 341/50; 341/51

(58) Field of Classification Search ................ 341/51, 341/50, 106; 375/240.25; 382/246, 239
See application file for complete search history.

(56) References Cited

U.S. PATENT DOCUMENTS

| | | | | |
|---|---|---|---|---|
| 5,406,279 A | * | 4/1995 | Anderson et al. | 341/51 |
| 5,532,693 A | * | 7/1996 | Winters et al. | 341/51 |
| 5,675,382 A | * | 10/1997 | Bauchspies | 375/240.25 |
| 5,708,511 A | * | 1/1998 | Gandhi et al. | 382/239 |
| 6,188,797 B1 | * | 2/2001 | Moledina et al. | 382/246 |
| 6,546,053 B1 | * | 4/2003 | Ishii | 375/240.27 |

OTHER PUBLICATIONS

Hsiun, "Programmable variable length decoder", USPGPUB 2003/0184457, filed on Nov. 12, 2002.*

* cited by examiner

*Primary Examiner*—Jean Bruner Jeanglaude
(74) *Attorney, Agent, or Firm*—Alan L. Pedersen-Giles

(57) ABSTRACT

A method may include performing an N bit-at-a-time matching operation for a first N bits in an encoded input stream of bits using a lookup table. The matching operation may obtain a first address in the table, and N may be an integer greater than one. The method may also include obtaining a second address in the table based on a mask and a jump address that are associated with the first address and a second number of bits in the encoded input stream. An index value may be output based on the second address in the table.

18 Claims, 8 Drawing Sheets

| Prg Ctr | Next Adr | Mask(base2)/Index(base10) | SHFT |
|---|---|---|---|
| 0 | | 1 | 3 |
| 1 | | 1 | 3 |
| 2 | 195 | 1010011101 | 4 |
| 3 | 187 | 01100001 | 4 |
| 4 | 167 | 0110000001 | 4 |
| 5 | 117 | 10001110010000100101 | 4 |
| 6 | | 32 | 3 |
| 7 | | 32 | 3 |
| 8 | | 0 | 2 |
| 9 | | 0 | 2 |
| 10 | | 0 | 2 |
| 11 | | 0,0 | 4 |
| 12 | | 45 | 4 |
| 13 | 92 | 001001010101 | 4 |
| 14 | 48 | 00110000100001011001 | 4 |
| 15 | 16 | 10011110100011001 | 4 |
| 16 | | 2 | |
| 17 | | 109 | |
| 18 | | 46 | |
| 19 | 33 | 1010011101 | |
| 20 | 36 | 00101 | |
| 21 | | 144 | |
| 22 | | 15 | |
| 23 | | 99 | |
| 24 | | 42 | |
| 25 | 44 | 101 | |
| 26 | | 118 | |
| 27 | | 121 | |
| 28 | | 141 | |
| 29 | | 147 | |
| 30 | 46 | 01 | |
| 31 | | 149 | |
| 32 | | 104 | |
| 33 | | 83 | |
| 34 | | 65 | |
| 35 | | 48 | |
| 36 | | 37 | |
| 37 | 41 | 101 | |
| 38 | | 76 | |
| 39 | | 57 | |
| 40 | | 123 | |
| 41 | | 20 | |
| 42 | | 62 | |
| 43 | | 51 | |
| 44 | | 129 | |
| 45 | | 77 | |
| 46 | | 151 | |
| 47 | | 106 | |
| 48 | 71 | 0010001001 | |
| 49 | 68 | 001 | |
| 50 | | 5 | |
| 51 | | 54 | |
| 52 | | 136 | |
| 53 | | 89 | |
| 54 | | 16 | |
| 55 | | 50 | |
| 56 | | 27 | |
| 57 | | 67 | |
| 58 | | 131 | |
| 59 | | 90 | |
| 60 | | 92 | |
| 61 | | 96 | |
| 62 | | 102 | |
| 63 | | 155 | |
| 64 | | 161 | |
| 65 | | 165 | |
| 66 | | 163 | |
| 67 | | 171 | |
| 68 | | ESCAPE | |
| 69 | | 35 | |
| 70 | | 128 | |
| 71 | 81 | 010001101 | |
| 72 | | 119 | |
| 73 | | 78 | |
| 74 | | 9 | |
| 75 | | 55 | |
| 76 | | 154 | |
| 77 | | 111 | |
| 78 | | 70 | |
| 79 | | 74 | |
| 80 | | 127 | |
| 81 | | 34 | |
| 82 | 90 | 01 | |
| 83 | | 134 | |
| 84 | | 12 | |
| 85 | | 49 | |
| 86 | | 101 | |
| 87 | | 26 | |
| 88 | | 58 | |
| 89 | | 84 | |
| 90 | | 36 | |
| 91 | | 60 | |
| 92 | | 53 | |
| 93 | | 64 | |
| 94 | | 72 | |
| 95 | 104 | 01 | |
| 96 | 106 | 0101 | |
| 97 | 110 | 0101 | |
| 98 | | 73 | |
| 99 | | 120 | |
| 100 | | 43 | |

200

| Prg Ctr | Next Adr | Mask(base2)/Index(base10) |
|---|---|---|
| 101 | | 63 |
| 102 | | 137 |
| 103 | | 88 |
| 104 | | 85 |
| 105 | | 138 |
| 106 | 114 | 101 |
| 107 | | 39 |
| 108 | | 164 |
| 109 | | 103 |
| 110 | | 17 |
| 111 | | 22 |
| 112 | | 28 |
| 113 | | 172 |
| 114 | | 156 |
| 115 | | 166 |
| 116 | | 21 |
| 117 | | 33 |
| 118 | 149 | 101 |
| 119 | 152 | 1001111 |
| 120 | 136 | 11101 |
| 121 | | 142 |
| 122 | | 14 |
| 123 | | 18 |
| 124 | | 79 |
| 125 | | 29 |
| 126 | | 71 |
| 127 | | 133 |
| 128 | | 139 |
| 129 | | 143 |
| 130 | | 98 |
| 131 | | 153 |
| 132 | | 157 |
| 133 | | 159 |
| 134 | | 167 |
| 135 | | 169 |
| 136 | 161 | 001 |
| 137 | | 38 |
| 138 | 141 | 11100001 |
| 139 | | 41 |
| 140 | | 23 |
| 141 | | 66 |
| 142 | | 82 |
| 143 | | 86 |
| 144 | | 80 |
| 145 | | 135 |
| 146 | | 94 |
| 147 | | 100 |
| 148 | | 145 |
| 149 | | 122 |
| 150 | | 7 |

| Prg Ctr | Next Adr | Mask(base2)/Index(base10) |
|---|---|---|
| 151 | | 130 |
| 152 | 159 | 01 |
| 153 | 164 | 101 |
| 154 | | 13 |
| 155 | | 61 |
| 156 | | 168 |
| 157 | | 107 |
| 158 | | 115 |
| 159 | | 10 |
| 160 | | 140 |
| 161 | | 69 |
| 162 | | 56 |
| 163 | | 95 |
| 164 | | 146 |
| 165 | | 93 |
| 166 | | 158 |
| 167 | 177 | 01 |
| 168 | 179 | 101 |
| 169 | 181 | 01 |
| 170 | | 8 |
| 171 | 183 | 0001 |
| 172 | | 114 |
| 173 | | 160 |
| 174 | | 105 |
| 175 | | 173 |
| 176 | | 30 |
| 177 | | 113 |
| 178 | | 4 |
| 179 | | 124 |
| 180 | | 75 |
| 181 | | 81 |
| 182 | | 47 |
| 183 | | 148 |
| 184 | | 117 |
| 185 | | 170 |
| 186 | | 24 |
| 187 | | 59 |
| 188 | | 68 |
| 189 | | 6 |
| 190 | | 132 |
| 191 | | 110 |
| 192 | | 150 |
| 193 | | 162 |
| 194 | | 97 |
| 195 | | 3 |
| 196 | | 116 |
| 197 | | 126 |
| 198 | 205 | 01 |
| 199 | 207 | 11001 |
| 200 | | 152 |

| Prg Ctr | Next Adr | Mask(base2)/Index(base10) |
|---|---|---|
| 201 | | 40 |
| 202 | | 25 |
| 203 | | 125 |
| 204 | | 112 |
| 205 | | 11 |
| 206 | | 87 |
| 207 | | 91 |
| 208 | | 19 |
| 209 | 212 | 44 |
| 210 | | 31 |
| 211 | | 52 |
| 212 | | 108 |
| 213 | | 44 |

Example-1: Incoming stream is 0100 0110 1001 ........

| Addr | NextAddr | Mask / Symbol | Operations |
|------|----------|---------------|------------|
|      |          |               | 0100 0110 1001 xx ..... |
| 4    | 167      |               | <u>0110 0000 01</u> |
|      | +4       | <=========== | 0000 1 |
| 171  | 183      |               | <u>000 1</u> |
|      | +2       | <=========== | 001 |
| 185  |          | 170       |            |

Fig. 5A

Example-2: Incoming stream is 0101 1000 1110 0100 00 ........

| Addr | NextAddr | Mask / Symbol | Operations |
|------|----------|---------------|------------|
|      |          |               | 0101 1000 1110 0100 00xx xxx........ |
| 5    | 117      |               | <u>1000 1110 0100 0100 101</u> |
|      | +13      | ============ | 0000 0000 0000 01 |
| 130  |          | 98        |            |

Fig. 5B

Example-3: Incoming stream is: 0101100111011100011010....

<u>a) Code-word-1:</u>
Start with the 1st 4 bits i.e.0101

Address: 5 has    (Next Address: 117, Mask: 10001110010000100101)
Xor the remaining bits with the Mask to get runs of 0's 100111011100011010....
10001110010000100101
0001xx    run of 3  + 117 = 120

Address 120: has    (Next Address: 136, Mask: 11101),
11011100011010....
11101
001xx    run of 2  + 136 = 138

Address 138: has    (Next Address: 141, Mask: 11100001, Hit=1)
11100011010...
11100001
0000001  run 6 + 141= 147, where we have the symbol with index 100.

<u>b) Code-words-2 & 3:</u>
Restart with next 4 bits 1010

Address 10: has two symbols one with index 0 and another with index also 0.

Fig. 5C

FAST COMPACT DECODER FOR HUFFMAN CODES

BACKGROUND

Implementations of the claimed invention generally may relate to decoding variable length codes and, more particularly, to decoding Huffman or similar entropy codes.

Electronic data, including text, graphics, voice, multimedia, and other strings of symbols, may be represented by binary codes. Binary coded data may be compressed in an effort to accurately represent the data while using as few bits as possible, thereby reducing the resources required for storing and/or transmitting the data. Binary codes of different or variable lengths may be used to represent different symbols in a bitstream of data. According to some binary code compression techniques, more frequently occurring symbols within a bitstream are represented with shorter codes, and less frequently occurring codes are represented using longer codes. Such a scheme may be referred to as Variable Length Coding (VLC).

One type of VLC scheme may involve Huffman codes. Huffman codes may be used, for example, in digital video compression and information retrieval for video coding standards such as Microsoft™ Windows Media, MPEG-2, MPEG-4, H.263, H.264, and other such standards employing VLC. In some implementations of Huffman codeword decoding, a bitstream segment of the incoming bitstream may be matched against the contents of a Look-Up-Table (LUT) according to a "nibble-by-nibble" approach. For example, a decoder may look into a first, fixed size nibble and try to match with first table entries in a Huffman decoding table. If no match is found, the decoder may look into a second, fixed size nibble and try to match with second table entries, and so forth. Such an approach may be conceptualized as a hashing function.

For longer Huffman codewords (e.g., 23 bit maximum), however, such nibbling schemes may take up to 6 steps and/or clocks to match the longest Huffman codewords. Longer codewords, in such a nibbling scheme, may limit decoding throughput. Such a scheme may also consume an undesirable amount of memory space for its Huffman decoding table.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

FIGS. 2A–2C illustrate an example, reformatted Huffman table;

FIGS. 5A–5C illustrate numerical examples using the process of FIG. 4 and the table of FIGS. 2A–2C.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed invention. However, it will be apparent to those skilled in the art having the benefit of the present disclosure that the various aspects of the invention claimed may be practiced in other examples that depart from these specific details. In certain instances, descriptions of well known devices, circuits, and methods are omitted so as not to obscure the description of the present invention with unnecessary detail.

Figure 1:
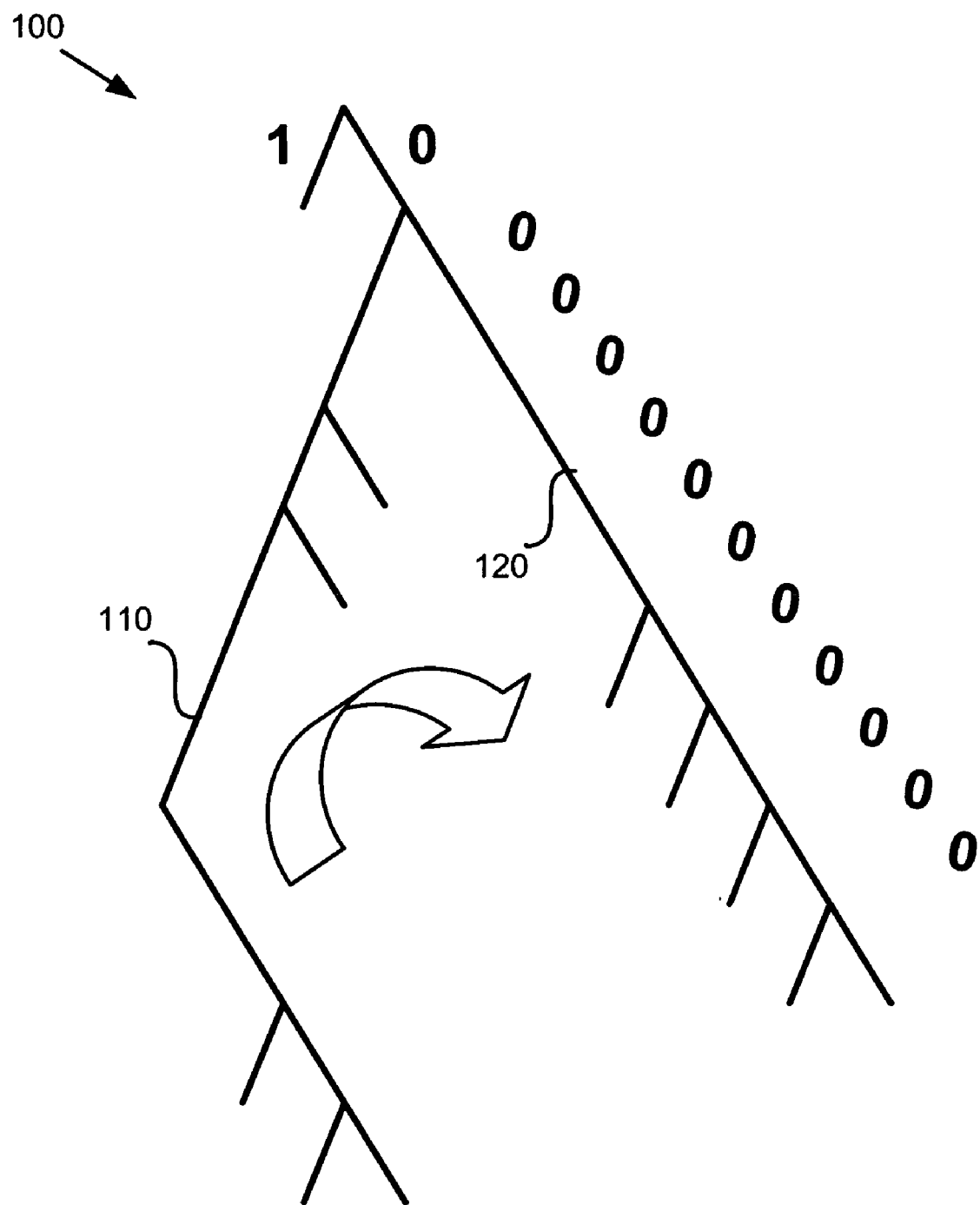
FIG. 1 illustrates a conceptual remapping of a Huffman tree.

FIG. 1 illustrates a conceptual remapping of a Huffman tree 100. It will be generally understood that Huffman decoding tables also may be represented in the form of a binary tree. One such Huffman tree 100 may include one or more "left" branches 110 and one or more "right" branches 120.

Left branches 110 may generally begin with one or more binary 1s, and right branches 120 may generally begin with one or more binary 0s. As will be explained herein, at least some of left branch(es) 110 may be remapped onto right branch(es) 120. This remapping of tree 100 may have the effect of compressing some of the entries associated with its leaves, and may result in generally longer runs of one binary value (e.g., 0 or 1), for example binary 0 if left branches 110 are those that are remapped.

Such longer runs of binary values may facilitate rapid detection, by dedicated hardware logic or a software detector (e.g., a leading zero detector (LZD)) or some combination thereof. If a Huffman table corresponds to the original Huffman tree 100, a "reformatted" Huffman table may correspond to the remapped Huffman tree.

Figure 2A:
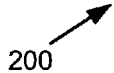
Figure 2C:

FIGS. 2A–2C illustrate an example, reformatted Huffman table 200 with 213 rows. Rows 0–100 appear in FIG. 2A; rows 101–200 appear in FIG. 2B; and rows 201–213 appear in FIG. 2C. Although described for the sake of convenience as a "table," reformatted Huffman table 200 may be implemented as a linked list, a series of pointers, or any other suitable data structure. Reformatted Huffman table 200 was obtained from a 175 code word by 23 bit (maximum) Huffman code table for Microsoft™ WMV-9, but it is not limited to any.

Table 200 maybe structured consistent with a combined four bit-at-a-time (4-BAAT) and Prefix Mapping scheme that will be described in greater detail below. The 4-BAAT portion of the decoding may involve the first 16 row-entries, the remaining rows of table 200 may be associated with Prefix mapping. Although the BAAT portion of table 200 appears first in FIG. 2A, in some implementations, the BAAT portion and the Prefix mapping portion may appear in any order, with or without interspersal of their respective entries. In FIGS. 2A–2C, however, after the first 16 rows, table 200 includes prefix Mask or Index (or indices/symbols) entries.

The first column of table 200 may include a memory address and/or Program Counter for accessing table 200 by a decoding processor and/or control logic. The second column of table 200 may include a Jump Address (e.g., "next" address) field whose purpose will be described further below. The jump address may also be referred to as a "base" address. The third column of table 200 may include either a decoded symbols (e.g., "index," in base 10 notation) or a prefix mask (e.g., in base 2 notation). As with the jump address, the index and prefix mask will be described further herein.

The fourth column of table 200 may include a shift amount associated with the BAAT portion (e.g., first 16 entries). The numbers in the fourth column indicate how many bits to shift the input data stream after processing associated with the entries in columns two and three.

Figure 3:
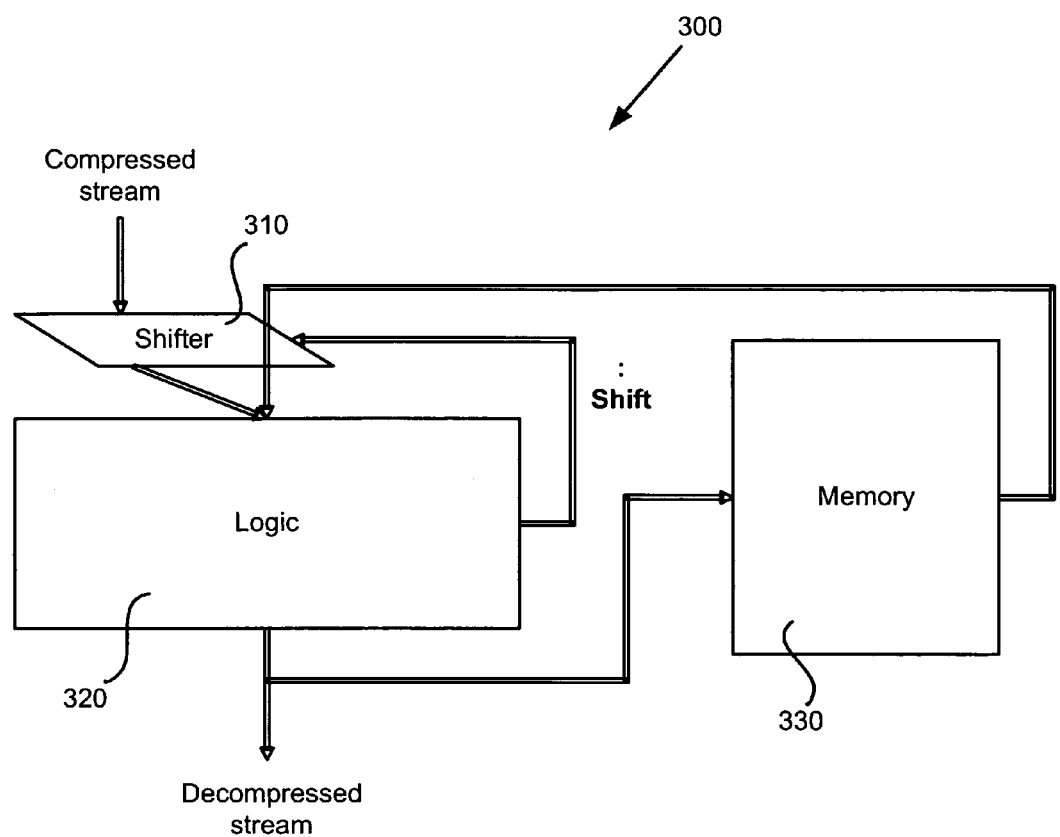
FIG. 3 illustrates an exemplary decoder.

FIG. 3 illustrates an exemplary decoder 300. Decoder 300 may include a shifter 310, logic 320, and a memory 330. Although illustrated as separate elements for ease of explanation, any or all of elements 310–330 may be co-located and/or implemented by a common group of gates and/or transistors.

Shifter 310 may include a shiftable buffer arranged to store and make accessible a portion of the compressed stream. In some implementations, shifter 310 may operate to make available the next bits of a given codeword that logic 320 needs to operate upon. In some implementations, shifter 310 may "shift out" bits that have already been processed. In some implementations, shifter 310 may not move bits as such, but rather may change a pointer location relative to a stationary series of bits. Other implementations are possible for shifter 310 consistent with the disclosure herein.

Logic 320 may include, in some implementations, a general-purpose or special-purpose processor configured to execute instructions or series of instructions to operate on data. In some implementations, processor 320 may be a general-purpose processing element that may execute available instructions, such as a leading zero detect (LZD) and/or trailing zero detect (TZD) operation. In some implementations, logic 320 may include a series of logical gates arranged to perform certain logical functions (e.g., AND, OR, XOR, NOR, etc.) on data from shifter 310 and/or memory 330. In some implementations, logic 320 may include both a processor and logical gates.

Logic 320 may control the timing and shift amount of shifter 310. Logic 320 may also control the decoding of the compressed stream using table 200 in memory 330 to output a decompressed stream of data.

Figure 4:
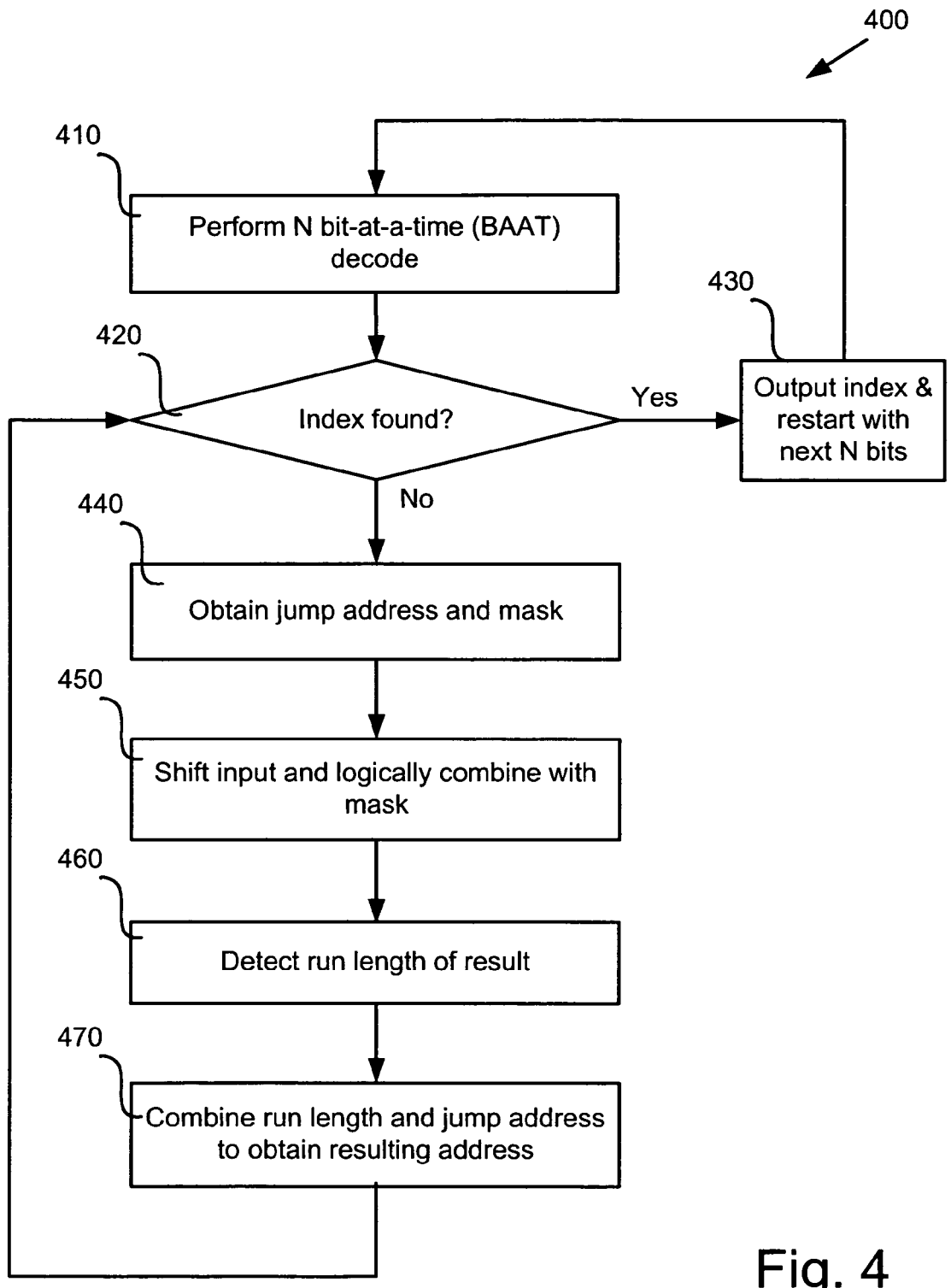
FIG. 4 illustrates an example decoding process.

Memory 330 may include storage device and/or series of gates for storing data arranged to store at least reformatted Huffman table 200. In some implementations, memory 330 may also store intermediate data products from logic 320 and/or instructions for logic 320. As one example, to store table 200, memory 330 may be as small as FIG. 4 illustrates an example process 400 of decoding Huffman codes from a compressed stream of data using, for example, table 200. Although FIG. 4 may be described with regard to table 200 and decoder 300 for ease and clarity of explanation, it should be understood that process 400 may be performed by other decoders than the specific reformatted table 200 and decoder 300 illustrated in FIGS. 2A–C and 3. In general, process 400 may involve a single BAAT operation (e.g., act 410) followed by one or more mask-based prefix detection operations (e.g., acts 440–470) if needed.

Processing may begin with logic 320 performing an N bit-at-a-time (BAAT) operation on the first N bits from shifter 310 [act 410]. Such BAAT operation may involve the first $2^N$ elements of table 200 in memory 330. Although table 200 is structured so that N=4, in some implementations N may equal 2 or a number larger than 4. Nor need N be fixed for an entire compressed stream, but may, in some implementations, vary within a compressed stream of data. The BAAT operation of act 410 may perform a lookup into the first $2^N$ elements of table 200 based on the first N bits of the input data.

Processing may continue with logic 320 checking whether an index value is found (as opposed to a jump address and mask) at the program counter (e.g., row value) indicated by the first N bits of data [act 420]. If act 420 does produce an index value, logic 320 may output this index value as part of the decompressed stream of data and restart process 400 at act 410 with the next N bits in the input stream (e.g., in shifter 310) [act 430].

If act 420 not does produce an index value, logic 320 may obtain the jump address and mask at the program counter (e.g., row value) indicated by the first N bits of data [act 440]. In table 200, the jump address may be found in the second column ("NextAdr"), and the mask may be found in the third column. As will be explained, the jump address may be used to compute the next program counter (e.g., row location) to examine in table 200. The mask may be a binary series of 1s and 0s, and may be relatively long as shown, for example, in rows 5 and 14 of table 200.

Logic 320 may direct shifter 310 to shift the input data and to logically combine the shifted input data with the mask obtained in act 440 [act 450]. Logic 320 may obtain the number of shift bits from column 4 of table 200 (e.g., a shift of 4 bits in each of rows 2–5). In some implementations, logic 320 may XOR the shifted input data from shifter 310 with the mask, although the claimed invention is not limited in this regard and may encompass any type of logical bitwise combination.

Processing may continue with logic 320 detecting a run length of the result of the logical combination of the shifted input data and mask in act 450 [act 460]. As used herein, "run length" may refer to a number of consecutive logical values (either 0s or 1s in some implementations) that are the same, beginning with a first bit of the result. For example, if the result starts with 0000101110 . . . , the run length detected in act 460 would be four, because of the four leading 0s. As indicated earlier, run length may be determined relatively rapidly by a hardware detector, a software/firmware LZD operation, or some combination thereof.

Logic 320 may arithmetically combine the run length and the jump address from act 440 to obtain a result address [act 470]. In some implementations, the values of the run length and the jump address may be added to obtain the result address, although other arithmetic combinations are both possible and contemplated in other implementations.

Logic 320 may check whether an index value is present at the result address [act 420] and if so, it may proceed to act 430 to output the index of the decoded symbol and to decode additional data. If no index value is present at the result address, logic may perform acts 440–470 again using the jump address and mask address present at the result address. In such subsequent processing, the number of bits to shift the input in act 450 may equal the run length from the prior act 460 plus one bit.

For a 23 bit (maximum) codeword Huffman table 200, process 400 may detect the longest codewords in four clocks, where a typical "all nibbling" scheme may take six clocks. Such improvement by process 400 may significantly reduce the decoding time for a macroblock of data (e.g., from about 2000 clocks maximum to about 1330 clocks maximum).

FIG. 5A illustrates a first numerical example using process 400 and table 200. In FIG. 5A, the first four bits, 0100, [act 410] correspond to address 4 in table 200, at which jump address 167 and a mask of 011000001 are obtained [act 440]. The input is shifted by 4 bits, and the mask is XORed with the shifted input [act 450] to obtain the result, 0000 1 . . . , which has a run length of 4 [act 460]. The jump address, 167, and the run length, 4, are added to obtain the resultant address 171 [act 470].

Acts 440–470 are repeated for the jump address, 183, and mask present at resultant address 171 to obtain a new result address of 185. At address 185, however, an index value of 170 is found [act 420], so this index may be output [act 430].

FIG. 5B illustrates a second numerical example using process 400 and table 200. In FIG. 5B, the first four bits, 0101, [act 410] correspond to address 5 in table 200, at which jump address 117 and a corresponding mask are obtained [act 440]. The input is shifted by 4 bits, and the mask is XORed with the shifted input [act 450] to obtain the result, 0000 0000 0000 01 . . . , which has a run length of 13 [act 460].

The jump address, 117, and the run length, 13, are added to obtain the resultant address 130 [act 470]. At address 130, an index value of 98 is found [act 420], and this index may be output [act 430]. In contrast to the first example in FIG. 5A, only one prefix matching operation was needed to reach the index value of 98.

FIG. 5C illustrates a third numerical example using process 400 and table 200. In FIG. 5C, acts 440–470 are repeated three times to proceed from the initial address of 5, to 120, 138, and 147, where index 100 is found [act 420]. Also in FIG. 5C, additional decoding of following codeword(s) is illustrated. In this particular case, address 10 produces two indices, both 0, after the first index of 100. These indices may be output in turn by logic 320 for further processing in the context of, for example, video decoding or other processing involving Huffman VLCs.

The foregoing description of one or more implementations provides illustration and description, but is not intended to be exhaustive or to limit the scope of the invention to the precise form disclosed. Modifications and variations are possible in light of the above teachings or may be acquired from practice of various implementations of the invention.

For example, although described in the context of Huffman codes, the invention herein is also applicable to any other suitable entropy code, such as Universal codes (e.g., Exp Golomb codes), etc. Further, the acts in FIG. 4 need not be implemented in the order shown; nor do all of the acts necessarily need to be performed. Also, those acts that are not dependent on other acts may be performed in parallel with the other acts. Further, at least some of the acts in this figure may be implemented as instructions, or groups of instructions, implemented in a machine-readable medium.

No element, act, or instruction used in the description of the present application should be construed as critical or essential to the invention unless explicitly described as such. Also, as used herein, the article "a" is intended to include one or more items. Variations and modifications may be made to the above-described implementation(s) of the claimed invention without departing substantially from the spirit and principles of the invention. All such modifications and variations are intended to be included herein within the scope of this disclosure and protected by the following claims.

What is claimed is:

1. A method comprising:
   performing a matching operation for a first number of bits in a compressed input stream using a lookup table to obtain an initial address in the table;
   obtaining a next address in the table based on a mask associated with the initial address and a next number of bits in the compressed input stream if the initial address is not associated with a decompressed value; and
   outputting the decompressed value based on the next address in the table.

2. The method of claim 1, wherein the first number of bits includes two bits or four bits.

3. The method of claim 1, wherein the obtaining includes:
   logically combining the mask and the next number of bits to produce a result.

4. The method of claim 3, wherein the obtaining further includes:
   adding a run length of the result to a base address to generate the next address.

5. The method of claim 1, further comprising:
   obtaining a further address in the table based on the next address in the table and another mask associated with the next address,
   wherein the outputting includes outputting the decompressed value associated with the further address in the table.

6. A method comprising:
   performing an N bit-at-a-time matching operation for a fist N bits in an encoded input stream of bits using a lookup table to obtain a first address in the table, N being an integer greater than one;
   obtaining a second address in the table based on a mask and a jump address that are associated with the first address and a second number of bits in the encoded input stream; and
   outputting an index value based on the second address in the table.

7. The method of claim 6, wherein N is four.

8. The method of claim 6, wherein the obtaining includes:
   generating a result by logically combining the mask and the second number of bits in the encoded input stream,
   determining a run length of the result, and
   combining the run length and the jump address to obtain the second address.

9. The method of claim 6, further comprising:
   obtaining a third address in the table based on the second address in the table and a second mask and a second jump address that are associated with the second address,
   wherein the outputting includes outputting the index value that is associated with the third address in the table.

10. The method of claim 6, wherein the index value is associated with the second address in the table.

11. A method of decoding encoded data, comprising:
   obtaining a next address and a binary mask based on a first address in a table;
   logically combining bits of the encoded data with the binary mask to generate a result;
   determining a run length of the result;
   combining the next address and the run length to generate a second address in the table; and
   outputting an index value associated with the second address in the table.

12. The method of claim 11, wherein the logically combining includes performing a bitwise exclusive OR (XOR) operation on the bits of the encoded data and the binary mask.

13. The method of claim 11, wherein the determining includes using a leading zero detector to determine a number of leading zeros of the result.

14. The method of claim 11, further comprising:
   performing a single bit-at-a-time (BAAT) matching operation to obtain the first address in the table.

15. An apparatus comprising:
a memory including:
  a table including a plurality of addresses, each of the plurality of addresses being associated with either an index value or a mask;
logic arranged to:
  combine the mask associated with a given address in the table with input binary data to obtain a result having a run length,
  combine the run length with a jump address associated with the given address in the table to obtain a next address in the table, and
  output an index value that is associated with the next address in the table.

16. The apparatus of claim 15, further comprising:
a shifter to shift the input binary data, the shifter being controlled by the logic.

17. The apparatus of claim 15, wherein the logic includes:
a leading zeros detector or a trailing zeros detector to determine the run length of the result.

18. The apparatus of claim 15, wherein the logic includes:
a leading ones detector or a trailing ones detector to determine the run length of the result.

* * * * *